United States Patent
Freyman et al.

(10) Patent No.: US 7,173,459 B2
(45) Date of Patent: Feb. 6, 2007

(54) TRIMMING METHOD AND APPARATUS FOR VOLTAGE CONTROLLED DELAY LOOP WITH CENTRAL INTERPOLATOR

(75) Inventors: Ronald L. Freyman, Bethlehem, PA (US); Mohammad S. Mobin, Orefield, PA (US); Vladimir Sindalovsky, Perkasie, PA (US); Lane A. Smith, Easton, PA (US)

(73) Assignee: Agere Systems Inc., Allentown, PA (US)

( * ) Notice: Subject to any disclaimer, the term of this patent is extended or adjusted under 35 U.S.C. 154(b) by 31 days.

(21) Appl. No.: 11/020,022

(22) Filed: Dec. 22, 2004

(65) Prior Publication Data

US 2006/0132206 A1 Jun. 22, 2006

(51) Int. Cl.
*H03L 7/06* (2006.01)
(52) U.S. Cl. .................... 327/149; 327/158
(58) Field of Classification Search ............ 327/149, 327/153, 158, 160, 162, 163, 175, 231; 375/371, 375/373, 375, 374; 331/17, 25
See application file for complete search history.

(56) References Cited

U.S. PATENT DOCUMENTS 6,043,717 A * 3/2000 Kurd ...................... 331/17
6,327,318 B1 * 12/2001 Bhullar et al. ............ 375/374

FOREIGN PATENT DOCUMENTS

WO    WO 97/14214    4/1997

* cited by examiner

*Primary Examiner*—Linh My Nguyen

(57) ABSTRACT

Methods and apparatus are provided for trimming a desired delay element in a voltage controlled delay loop. The disclosed trimming process comprises the steps of obtaining a first phase signal of a reference clock; applying the first phase signal along a first path to the desired delay element and a common delay element connected in series to the desired delay element; applying the reference clock along a second path to a first delay element and the common delay element; measuring a delay difference between the first and second paths at an output of the common delay element; and adjusting a delay of the desired delay element based on the measured delay difference. The trimming method may be repeated for each delay element in a voltage controlled delay loop.

20 Claims, 5 Drawing Sheets

TRIMMING METHOD AND APPARATUS FOR VOLTAGE CONTROLLED DELAY LOOP WITH CENTRAL INTERPOLATOR

CROSS-REFERENCE TO RELATED APPLICATIONS

The present invention is related to U.S. patent application Ser. No. 10/999,900, entitled, "Voltage Controlled Delay Loop and Method with Injection Point Control," and U.S. patent application Ser. No. 10/999,889, entitled, "Voltage Controlled Delay Loop With Central Interpolator," each filed on Nov. 30, 2004, and U.S. patent application Ser. No. 11/020,021, entitled, "Phase Interpolator Having A Phase Jump," filed contemporaneously herewith and each incorporated by reference herein.

FIELD OF THE INVENTION

The present invention is related to techniques for clock and data recovery (CDR) and, more particularly, to methods and apparatus for digital control of the generation and selection of different phases of a clock signal.

BACKGROUND OF THE INVENTION

In many applications, including digital communications, clock and data recovery (CDR) must be performed before data can be decoded. Generally, in a digital clock recovery system, a reference clock signal of a given frequency is generated together with a number of different clock signals having the same frequency but with different phases. In one typical implementation, the different clock signals are generated by applying the reference clock signal to a delay network. Thereafter, one or more of the clock signals are compared to the phase and frequency of an incoming data stream and one or more of the clock signals are selected for data recovery.

A number of existing digital CDR circuits use voltage controlled delay loops (VCDL) to generate a number of clocks having the same frequency and different phase for data sampling (i.e., oversampling). For example, published International Patent Application No. WO 97/14214, discloses a compensated delay locked loop timing vernier. The disclosed timing vernier produces a set of timing signals of similar frequency and evenly distributed phase. An input reference clock signal is passed through a succession of delay stages. A separate timing signal is produced at the output of each delay stage. The reference clock signal and the timing signal output of the last delay stage are compared by an analog phase lock controller. The analog phase lock controller controls the delay of all stages so that the timing signal output of the last stage is phase locked to the reference clock. Based on the results of the oversampled data, the internal clock is delayed so that it provides data sampling adjusted to the center of the "eye." The phase of the VCDL is adjusted to keep up with phase deviations of the incoming data.

While such voltage controlled delay loops effectively generate the sampling clocks and control the delay stages to maintain alignment of the reference clock signal and the last timing signal, they suffer from a number of limitations, which if overcome, could further improve the utility of such voltage controlled delay loops. For example, when the voltage controlled delay loops are implemented using integrated circuit technology, an inherent mismatch exists between the various delay stages, causing nonlinearities in the generated phases of the clock sources. A need therefore exists for a trimming method for a voltage controlled delay loop to compensate for such mismatched delay stages.

SUMMARY OF THE INVENTION

Generally, methods and apparatus are provided for trimming a desired delay element in a voltage controlled delay loop. The disclosed trimming process comprises the steps of obtaining a first phase signal of a reference clock; applying the first phase signal along a first path to the desired delay element and a common delay element connected in series to the desired delay element; applying the reference clock along a second path to a first delay element and the common delay element; measuring a delay difference between the first and second paths at an output of the common delay element; and adjusting a delay of the desired delay element based on the measured delay difference.

The delay difference may be measured, for example, by applying the signals from the first and second paths to a data latch having a source of phase controlled data, such as a roaming tap interpolator. The delay of the desired delay element may be adjusted, for example, by setting one or more register control bits that adjust a tail current of the desired delay element. In a voltage controlled delay loop having a plurality of delay elements, the trimming method may be repeated for each delay element.

A more complete understanding of the present invention, as well as further features and advantages of the present invention, will be obtained by reference to the following detailed description and drawings.

DETAILED DESCRIPTION

Figure 1:
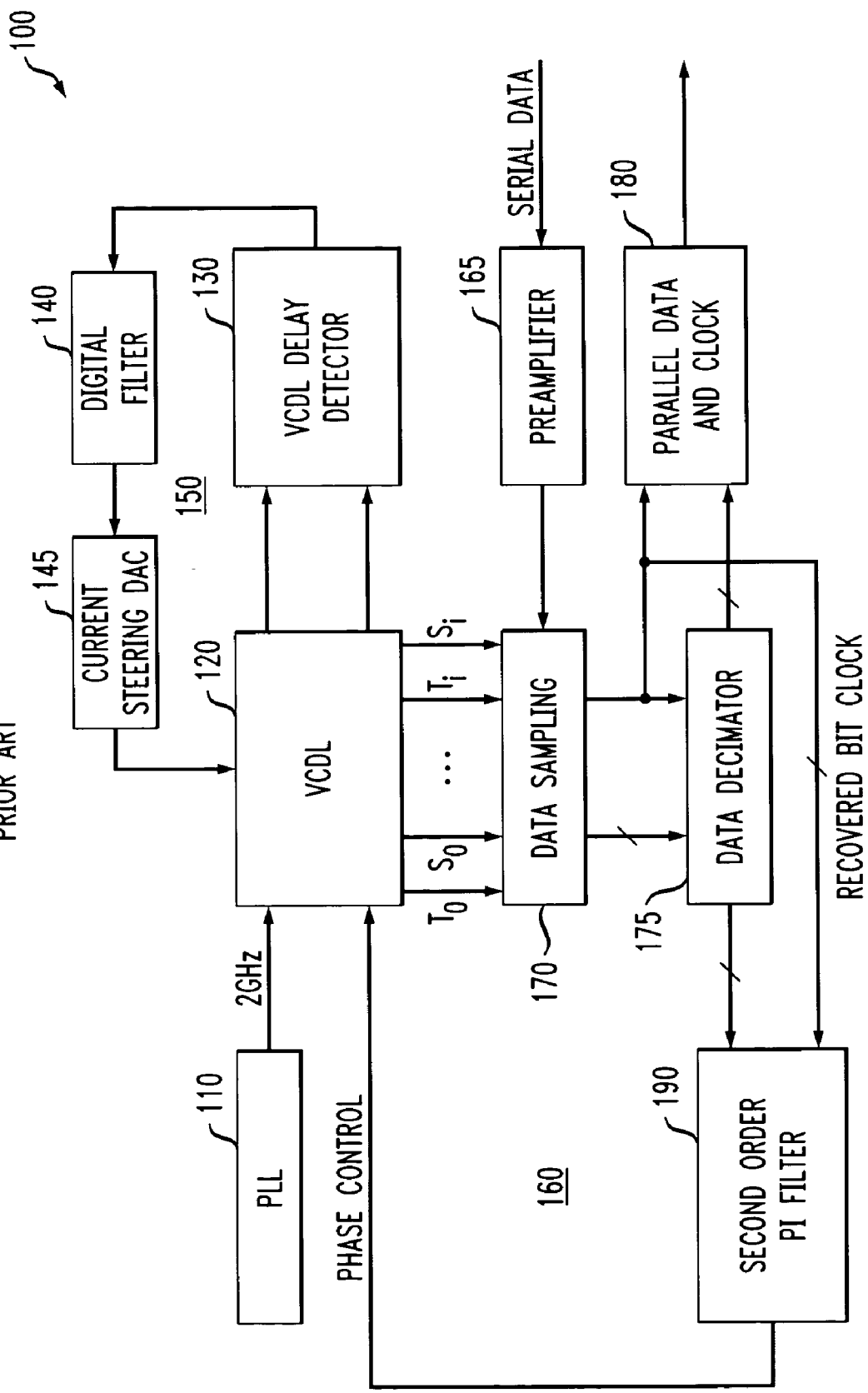
FIG. 1 illustrates an exemplary conventional clock recovery circuit.

The present invention provides a trimming method for voltage controlled delay loops with digital phase control. FIG. 1 illustrates an exemplary conventional clock recovery circuit 100. As shown in FIG. 1, the clock recovery circuit 100 produces a clock signal with a predetermined number of phases, $T_0$, $S_0$, ... $T_i$, $S_i$, discussed below in conjunction with FIG. 2. The exemplary clock recovery circuit 100 includes a reference clock signal (3 GHz, for example) generated by a phase locked loop (PLL) 110 and applied to the input of a voltage controlled delay loop 120. As shown in FIG. 1, the voltage controlled delay loop 120 interacts with two control loops 150, 160. The first phase control loop 150 is comprised of a VCDL phase detector 130, a digital filter 140 and a current steering DAC 145. Generally, the first control loop 150 adjusts the delays of the voltage controlled delay loop 120. The reference signal and the output of the VCDL 120 are applied to the VCDL phase detector 130 which provides phase detection by producing an output representative of the phase difference that is applied to a filter 140 whose digital output is converted to an analog current by the DAC 145 to control the delay in the stages of the voltage controlled delay loop 120.

The second data control loop 160 is comprised of a preamplifier 165, a data sampling block 170, a data decimator 175, a parallel data and clock output block 180 and a second order proportional and integral (PI) filter 190. The serial data is received and amplified by the preamplifier 165 and applied to the data sampling block 170. The data sampling block 170 samples the data using the plurality of phases, $T_0, S_0, \ldots T_i, S_i$. The data samples are then applied to the optional data decimator 175 that drops the data rate, for example, by a factor of two. In addition, the data sampling block 170 provides a recovered bit clock output that is applied to the data decimator 175, parallel data and clock output block 180 and second order PI filter 190. The parallel data and clock output block 180 outputs the sampled serial data and recovered lower frequency clock as parallel data (usually 16 or 20 bit wide) and clock. The second order PI filter 190 interprets the transition and data sample information associated with the, $T_0, S_0, \ldots T_i, S_i$ samples to generate phase control information for the VCDL 120. Generally, the phase control information ensures that the transitions clocks are maintained close to the transition points in the serial data (see FIG. 2).

Figure 2:
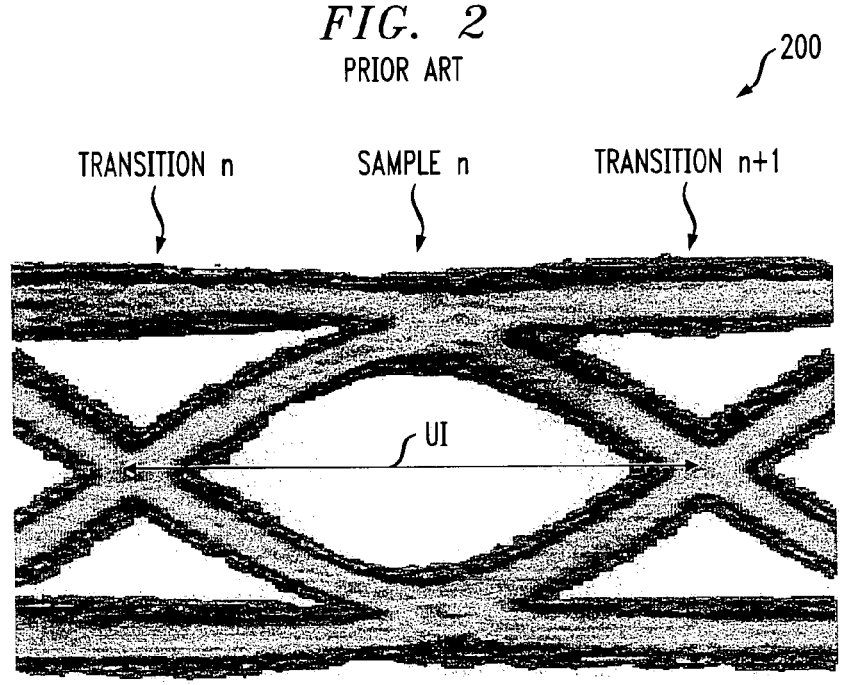
FIG. 2 illustrates the transitions in a data stream.

FIG. 2 illustrates the transitions in a data stream 200. As shown in FIG. 2, the data is ideally sampled in the middle between two transition points. The phases $T_i, S_i$ generated by the VCDL 120 are adjusted to align with the transitions and sample points, respectively. Thus, the internal clock is delayed so that the data sampling is adjusted to the center of the "eye," in a known manner.

Figure 3:
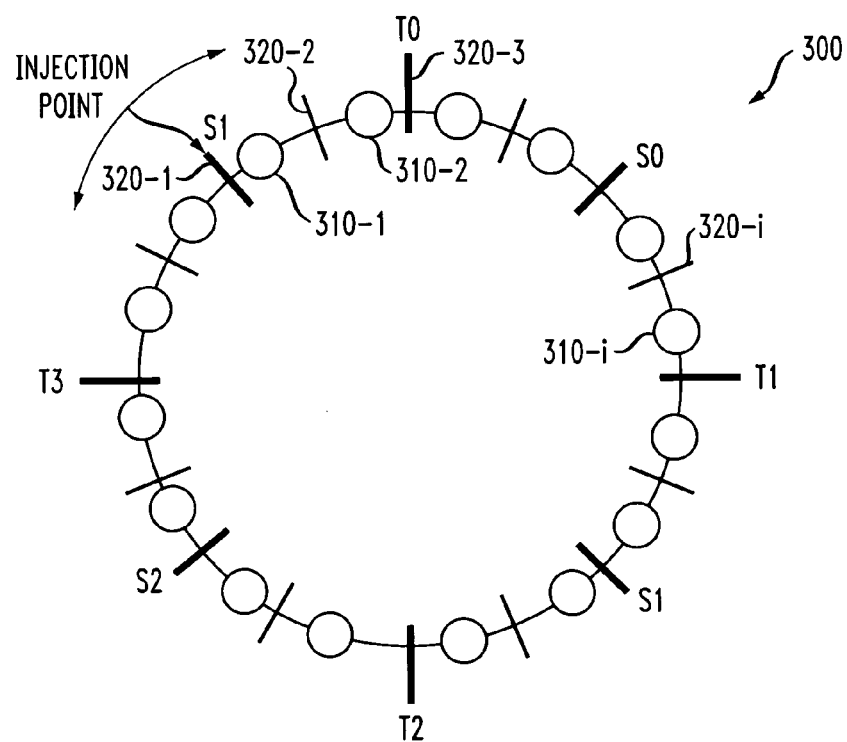
FIG. 3 illustrates a VCDL having coarse phase control.

FIG. 3 illustrates a VCDL 300 having coarse phase control. In order to control the phase offset between the PLL frequency and data sampling ($S_i$) and transition sampling ($T_i$), the injection point of the PLL frequency into the VCDL 120 is shifted. As shown in FIG. 3, the exemplary VCDL 300 is generally comprised of a succession of 16 delay elements, for example, 310-1 through 310-16 interconnected in a loop. The exemplary VCDL 300 also includes 16 inputs 320-1 through 320-16 that are each connected to an associated delay line 310-$i$. The correlation between the various phases $T_i, S_i$ generated by the VCDL 300 to the delay elements 310 is also shown in FIG. 3. As shown in FIG. 3, the injection point where the PLL signal is applied to the VCDL can be shifted in accordance with the present invention to any input 320-$i$.

The embodiment of FIG. 3 moves the injection point by one full delay element, thereby producing significant quantization noise in the VCDL 300. In the exemplary embodiment of FIG. 3, with four delay elements per unit interval (UI), the quantization noise would be +/−¼ UI, which limits the jitter tolerance of the CDR to ½ UI. Thus, the movement of the injection point may not be fine enough to provide the necessary precision in the phase adjustment. In order to resolve this problem, a phase interpolator can be used, as discussed further below in conjunction with FIG. 5. The interpolator provides a fractional delay between the output phases from the delay elements.

Figure 4:
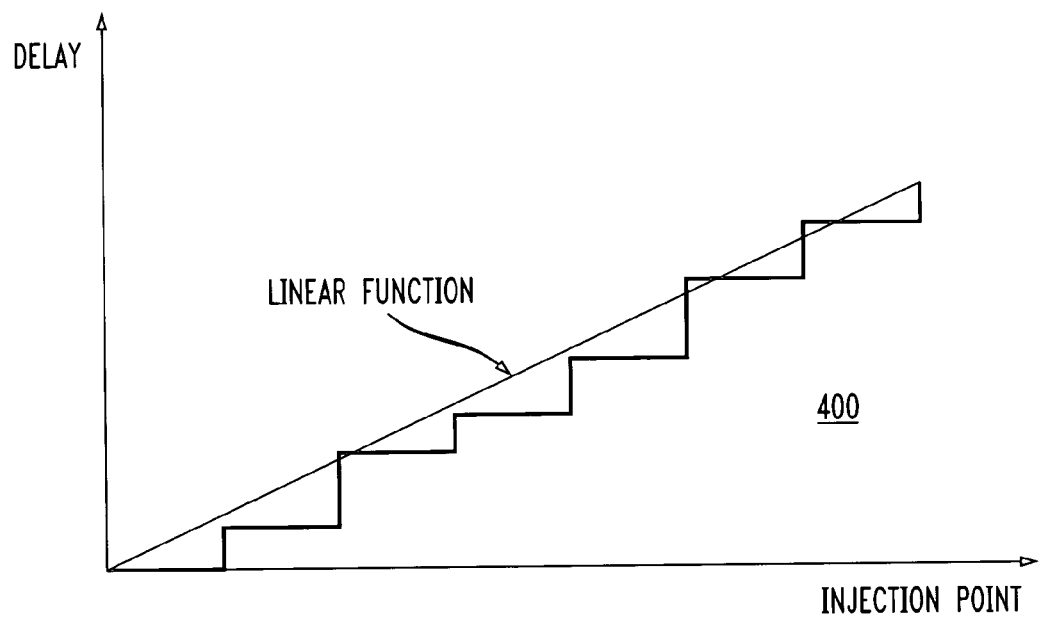
FIG. 4 illustrates the nonlinearity of the delay as a function of the injection point for the VCDL of FIG. 3.

In addition, when the VCDL 300 is implemented in integrated circuit technology, an inherent mismatch exists between delay stages. For example, in 90 nm technology, the mismatch may be as much as +/−8 picoseconds (for small transistor sizes) which constitutes +/−5% at an exemplary data rate of 6.25 Gbps. This mismatch leads to nonlinearity of the delay as a function of the injection point which results in reduced jitter tolerance, as shown in FIG. 4.

Figure 5:
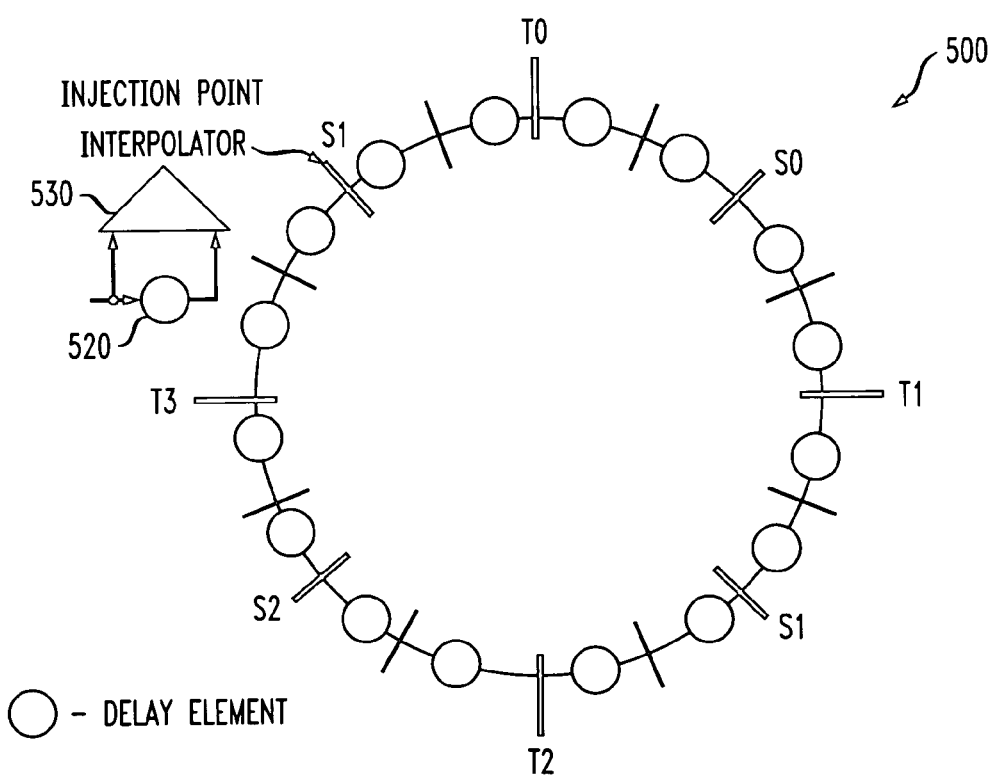
FIG. 5 illustrates a VCDL providing coarse phase control and fine phase control provided by a central interpolator.

FIG. 5 illustrates a VCDL 500 incorporating features of the present invention and having the coarse phase control provided by the injection point control of FIG. 3, as well as a fine phase control provided by a central interpolator 530. Thus, the PLL signal that is injected into the VCDL 500 is first interpolated to provide fine phase control. Following the fine phase control, the injection point may optionally be adjusted to provide a coarse phase control, using the approach of FIG. 3.

For a detailed discussion of a suitable central interpolator 530, see United States Patent Application entitled, "Voltage Controlled Delay Loop With Central Interpolator," application Ser. No. 10/999,889 filed on Nov. 30, 2004 and incorporated by reference herein. Generally, an input PLL signal, for example, having a frequency of 1–3 GHz, is applied to a delay stage 520 having one or more delay elements (e.g., each providing a ¼ UI delay). The delay stage 520 is connected to the central interpolator 530 such that the left and right inputs to the central interpolator 530 are separated by at least one delay element, as shown in FIG. 5.

The exemplary central interpolator 530 provides a number, for example 8, distinct phases (over ¼ UI range), between each coarse phase setting. A multiplexer selects the desired phase. If the phase must be adjusted beyond the granularity provided by the central interpolator 530 (i.e., more than a ¼ UI), then a coarse phase adjustment is made by adjusting the injection point (providing a granularity of ¼ UI). If, for example, the central interpolator 530 generates seven additional phases between delay stages, quantization noise is improved by a factor of 8 to +/−⅟32 UI, and thus jitter tolerance of the VCDL is significantly improved.

Figure 6:
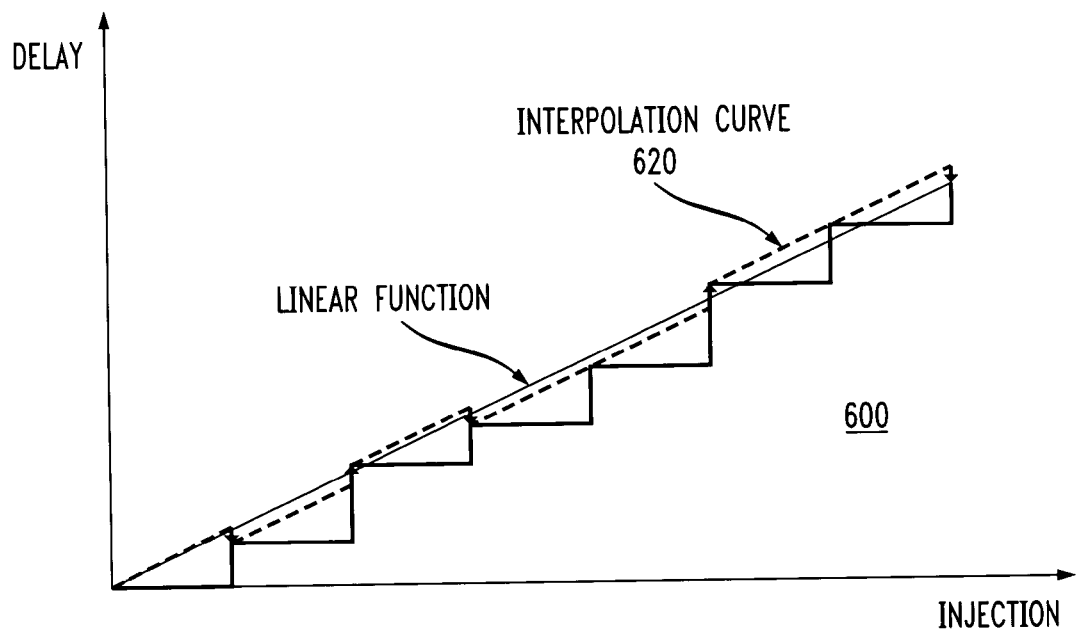
FIG. 6 illustrates the nonlinearity of the delay as a function of the injection point for the VCDL of FIG. 5.

The central interpolator 530 of FIG. 5, however, also introduces additional nonlinearities. In particular, since the central interpolator 530 is based on one or more separate delay elements 520 that may not be matched to the delay elements 310 of the VCDL 300, the central interpolator 530 can introduce additional nonlinearity to the delay adjustment, as shown in FIG. 6 by the jump in phase (delay) at the points of discontinuity in the interpolation curve 620.

The present invention recognizes that the existence of central interpolator 530 allows for a trimming scheme in the VCDL 500. The disclosed trimming scheme allows the VCDL delay stages 310 to be trimmed to the delay stage(s) 520 of the central interpolator 530. In this manner, the delay elements 310, 520 of the VCDL 500 can be adjusted (trimmed) to produce evenly spaced and linearly phase controlled sampling clocks.

Figure 7:
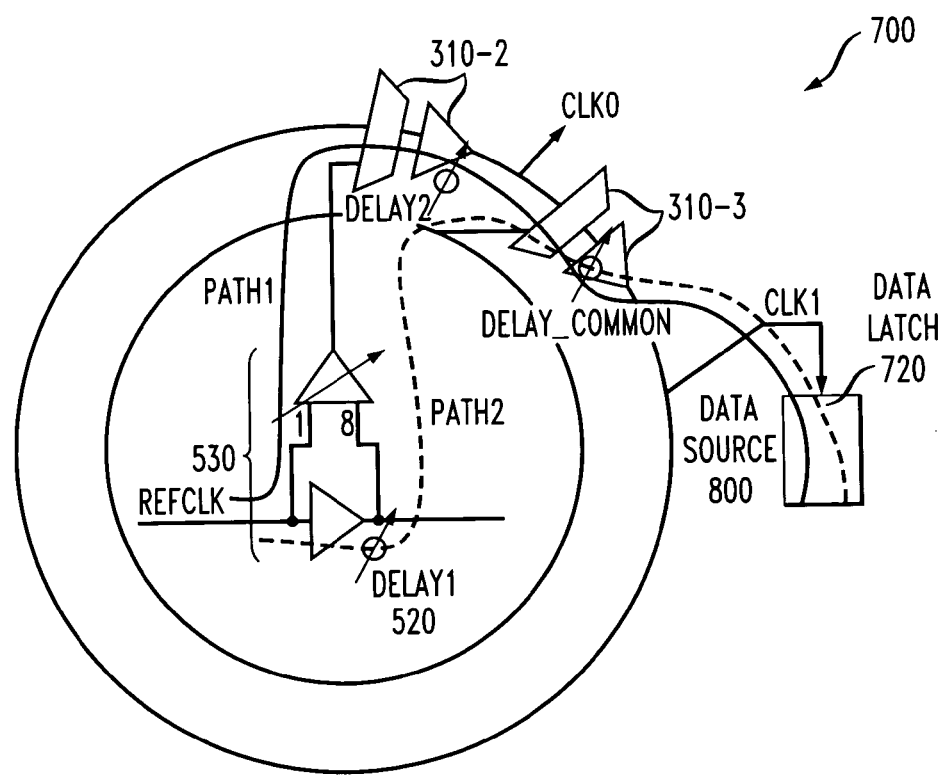
FIG. 7 illustrates a VCDL incorporating features of the present invention.

FIG. 7 illustrates a VCDL 700 incorporating features of the present invention. The VCDL 700 employs the injection point control of FIG. 3 to obtain coarse phase control using the selective delay elements 310, as well as the central interpolator 530 of FIG. 5 for fine phase control. The PLL signal that is injected into the VCDL 700 is first interpolated by the central interpolator 530 to provide fine phase control. Following the fine phase control, the injection point may optionally be adjusted to select a given delay element 310 and thereby provide a coarse phase control, using the approach of FIG. 3.

As shown in FIG. 7, the PLL frequency (labeled REFCLK in FIG. 7) can be controlled in a way that it is interpolated in the central interpolator 530 with a minimum delay (Path 1) or a full interpolation delay (Path 2). In the exemplary configuration shown in FIG. 7, the injection point is Delay 2 (310-2) for the Path 1 scenario, and Delay_common (310-3) for the Path 2 scenario. Upon analysis of the two paths, it can be seen that both paths share the Delay_common delay element and the difference between the two paths is that Delay 1 (520) is exchanged for Delay 2. Thus, if the same timing is ensured by trimming for CLK1 at the output of Delay_common in both scenarios, then Delay 2 is equal to Delay 1. The trimming can be performed, for example, by setting register control bits which would change the tail current of the respective delay element 310, thus changing the value of Delay 2. The same procedure can be repeated for every delay element 310 in the VCDL 700, trimming them all to the value of the central interpolator Delay 1. It is assumed that mismatch in the multiplexers in front of a delay element in the VCDL 700 is negligible compared to the mismatch in the delay elements.

Figure 8:
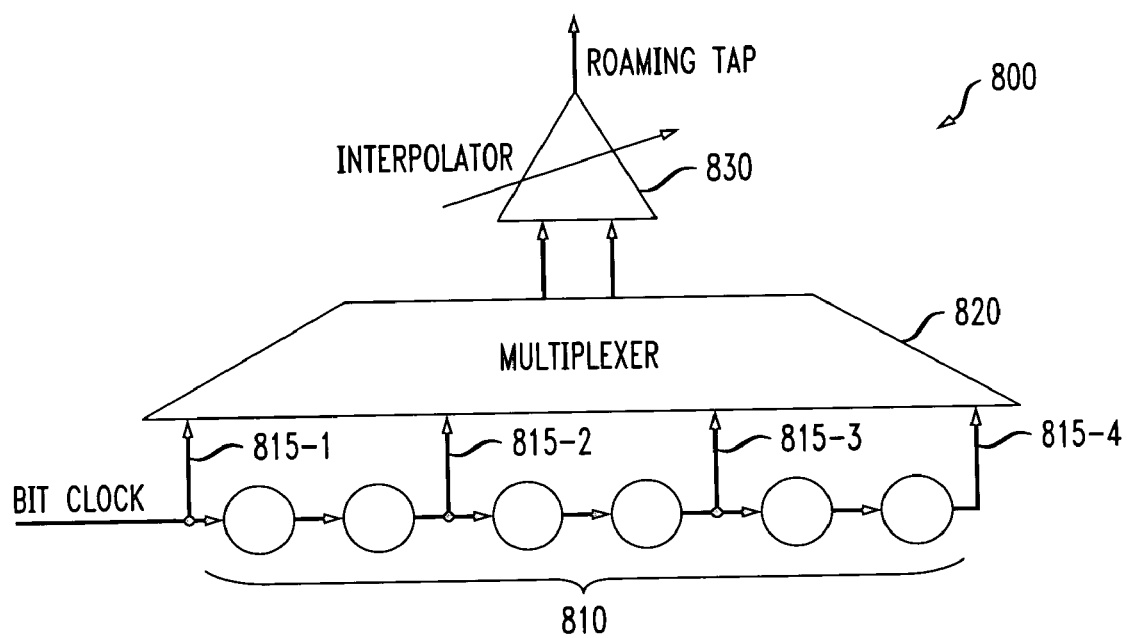
FIG. 8 is a schematic block diagram of an exemplary roaming tap interpolator that provides a source of phase controlled data for the data latch of FIG. 7.

In the exemplary embodiment of FIG. 7, the timing of CLK1 is detected during trimming using a source 800 of phase controlled data, as discussed further below in conjunction with FIG. 8, at the Data input of a Data Latch 720. Since trimming is done to bring the CLK1 switching event to the same phase relative to the REFCLK, the Data phase control must be monotonic, but not necessarily linear. A suitable technique for creating phase controlled data is to use an interpolated clock from the VCDL of an adjacent channel, as shown in FIG. 8. The output of every data latch is available for analysis because it is assembled in the parallel output data of CDR.

FIG. 8 is a schematic block diagram of an exemplary roaming tap interpolator 800. The roaming tap interpolator 800 may be employed, for example, as the source of phase controlled data for the trimming of voltage controlled delay loops, as described herein. For a more detailed discussion of such roaming tap interpolators, see United States Patent Application entitled, "Phase Interpolator Having A Phase Jump," application Ser. No. 11/020,021 filed contemporaneously herewith and incorporated by reference herein.

As shown in FIG. 8, the roaming tap interpolator 800 receives a reference clock signal, such as a bit clock, for example, from a PLL, that is applied to a delay bank 810. The delay bank 810 is comprised of a number of delay elements. The delay elements in the delay bank 810 produce multiple clock phases which can be interpolated so that the Roaming Tap can be moved to any phase within the period of the Bit Clock.

Interpolation gives the best result when interpolated clock phases are close. Thus, the Bit Clock period is typically divided into several regions. In the exemplary embodiment shown in FIG. 8, the delay bank 810 can be tapped at four different locations, 815-1 through 815-4, to provide four corresponding interpolation regions.

Each region is separately selected by a multiplexer 820 and separately interpolated by the interpolator 830, in a known manner. When the boundary of an interpolation region is reached, the roaming tap interpolator 800 switches to the adjacent region. In the exemplary embodiment of FIG. 8, each region of interpolation spans 90° of the Bit Clock, and each delay element in the bank 810 provides a delay of ⅛ of the Bit Clock period.

A plurality of identical die are typically formed in a repeated pattern on a surface of the wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

It is to be understood that the embodiments and variations shown and described herein are merely illustrative of the principles of this invention and that various modifications may be implemented by those skilled in the art without departing from the scope and spirit of the invention.

We claim:

1. A method for trimming a desired delay element in a voltage controlled delay loop, comprising the steps of:
    obtaining a first phase signal of a reference clock;
    applying said first phase signal along a first path comprising said desired delay element and a common delay element connected in series to said desired delay element;
    applying said reference clock along a second path comprising a first delay element and said common delay element, wherein said second path is different from said first path;
    measuring a delay difference between said first and second paths at an output of said common delay element; and
    adjusting a delay of said desired delay element based on said measured delay difference.

2. The method of claim 1, wherein said measuring step further comprises the step of applying said signals from said first and second paths to a data latch having a source of phase controlled data.

3. The method of claim 2, wherein said source of phase controlled data is a roaming tap interpolator.

4. The method of claim 1, wherein said adjusting step further comprises the step of setting one or more register control bits that adjust a tail current of said desired delay element.

5. The method of claim 1, further comprising the step of repeating said method for a plurality of desired delay elements in said voltage controlled delay loop.

6. The method of claim 1, wherein said voltage controlled delay loop comprises a plurality of delay elements connected in series.

7. The method of claim 1, wherein an output of said voltage controlled delay loop is used for clock and data recovery.

8. A voltage controlled delay loop, comprising:
    a central interpolator for generating at least a first and second phase signal of a reference clock using at least one delay element;
    a plurality of delay elements connected in series, whereby an output of said central interpolator is selectively injected into any one of said plurality of delay elements;
    a data latch to measure a delay difference between said first phase signal along a first path and said second phase signal along a second path, wherein said first path comprises a desired delay element and a common delay element connected in series to said desired delay element and said second path comprises a first delay element and said common delay element.

9. The voltage controlled delay loop of claim 8, further comprising means for adjusting a delay of said desired delay element based on said measured delay difference.

10. The voltage controlled delay loop of claim 9, wherein said means for adjusting is further configured to set one or more register control bits that adjust a tail current of said desired delay element.

11. The voltage controlled delay loop of claim 8, wherein said data latch receives a source of phase controlled data.

12. The voltage controlled delay loop of claim 11, wherein said source of phase controlled data is a roaming tap interpolator.

13. The voltage controlled delay loop of claim 8, wherein said measurement of said delay difference is repeated for a plurality of desired delay elements.

14. The voltage controlled delay loop of claim 8, wherein an output of said voltage controlled delay loop is used for clock and data recovery.

15. An integrated circuit, comprising:
 a voltage controlled delay loop, comprising:
 a central interpolator for generating at least a first and second phase signal of a reference clock using at least one delay element;
 a plurality of delay elements connected in series, whereby an output of said central interpolator is selectively injected into any one of said plurality of delay elements;
 a data latch to measure a delay difference between said first phase signal along a first path and said second phase signal along a second path, wherein said first path comprises a desired delay element and a common delay element connected in series to said desired delay element and said second path comprises a first delay element and said common delay element.

16. The integrated circuit of claim 15, further comprising means for adjusting a delay of said desired delay element based on said measured delay difference.

17. The integrated circuit of claim 16, wherein said means for adjusting is further configured to set one or more register control bits that adjust a tail current of said desired delay element.

18. The integrated circuit of claim 15, wherein said data latch receives a source of phase controlled data.

19. The integrated circuit of claim 18, wherein said source of phase controlled data is a roaming tap interpolator.

20. The integrated circuit of claim 15, wherein said measurement of said delay difference is repeated for a plurality of desired delay elements.

* * * * *